(12) United States Patent
Lin et al.

(10) Patent No.: US 8,597,058 B2
(45) Date of Patent: Dec. 3, 2013

(54) CARD HOLDER

(75) Inventors: Chih-Chiang Lin, New Taipei (TW); Ta-Chih Yu, New Taipei (TW)

(73) Assignee: Proconn Technology Co., Ltd., New Taipei (TW)

( * ) Notice: Subject to any disclaimer, the term of this patent is extended or adjusted under 35 U.S.C. 154(b) by 47 days.

(21) Appl. No.: 13/426,839

(22) Filed: Mar. 22, 2012

(65) Prior Publication Data

US 2013/0252470 A1    Sep. 26, 2013

(51) Int. Cl.
*H01R 24/00*     (2011.01)

(52) U.S. Cl.
USPC .......................................... 439/630

(58) Field of Classification Search
USPC ................ 439/630, 327; 361/752; 455/558
See application file for complete search history.

(56) References Cited

U.S. PATENT DOCUMENTS

| 5,937,359 | A * | 8/1999 | Jubert | 455/558 |
| 6,561,431 | B2 * | 5/2003 | Roussy et al. | 235/492 |
| 6,632,097 | B2 * | 10/2003 | Chang | 439/76.1 |
| 8,456,852 | B2 * | 6/2013 | Xiao et al. | 361/752 |
| 2011/0157846 | A1 * | 6/2011 | Xiao et al. | 361/752 |

* cited by examiner

*Primary Examiner* — Alexander Gilman

(57) ABSTRACT

A card holder adapted for converting a micro SIM card into a standard SIM card in size and shape includes an insulating housing of a flat board shape which is in accordance with the standard SIM card in size and shape, and defines a card groove in accordance with the micro SIM card in size and shape and in accordance with the standard SIM card in contact position for receiving the micro SIM card in place. At least one groove sidewall of the card groove defines an open slot spaced from the card groove for accordingly forming at least one elastic arm between the open slot and the card groove, wherein the elastic arm further projects into the card groove for resisting against the micro SIM card. A metal part is molded in the insulating housing and exposed in the card groove for supporting the micro SIM card thereon.

5 Claims, 3 Drawing Sheets

CARD HOLDER

BACKGROUND OF THE INVENTION

1. Field of the Invention

The present invention relates to a card holder, and more particularly to a card holder adapted for converting a micro SIM card into a standard SIM card in size and shape.

2. The Related Art

With the development of information technology, mobile phones have been widely used in our lives. When the mobile phone is used, it needs to install a SIM card therein. The SIM card is an identity card for a mobile phone user in order to realize the information transmission of the communication network. At present, the mobile phone generally uses a standard SIM card as the identity card. However, with the development of the mobile phone tending to thin and small configuration, a micro SIM card having a smaller size than that of the standard SIM card comes with the tide of fashion. The standard SIM card often fails to be used in the mobile phone which is designed for receiving the micro SIM card therein. In order to meet the need of actual use, the mobile phone user has to cut the standard SIM card into the micro SIM card in size and shape. However, the standard SIM card is easily damaged in the process of being cut. Besides, after changing the size of the standard SIM card in accordance with that of the micro SIM card, the changed SIM card can't be reused in the mobile phone adapted for receiving the foregoing standard SIM card therein. As a result, it brings loss and inconvenience to the mobile phone user.

SUMMARY OF THE INVENTION

Accordingly, an object of the present invention is to provide a card holder adapted for converting a micro SIM card into a standard SIM card in size and shape. The card holder includes an insulating housing of a flat board shape which is in accordance with the standard SIM card in size and shape, and defines a card groove in accordance with the micro SIM card in size and shape and in accordance with the standard SIM card in contact position for receiving the micro SIM card in place. At least one groove sidewall of the card groove defines an open slot penetrating through a top surface and a bottom surface of the insulating housing and spaced from the card groove for accordingly forming at least one elastic arm between the open slot and the card groove, wherein the elastic arm further projects into the card groove for resisting against the micro SIM card. Furthermore, a metal part is molded in the insulating housing and exposed in the card groove for supporting the micro SIM card thereon.

As described above, by using the card holder, the micro SIM card can be conveniently converted into the standard SIM card in size and shape. As a result, the micro SIM card not only can be used in a mobile phone which is designed for receiving the micro SIM card, but also can be used in a mobile phone adapted for receiving the standard SIM card therein after being assembled in the card holder.

BRIEF DESCRIPTION OF THE DRAWINGS

The present invention will be apparent to those skilled in the art by reading the following description thereof, with reference to the attached drawings, in which.

DETAILED DESCRIPTION OF THE EMBODIMENT

Figure 1:
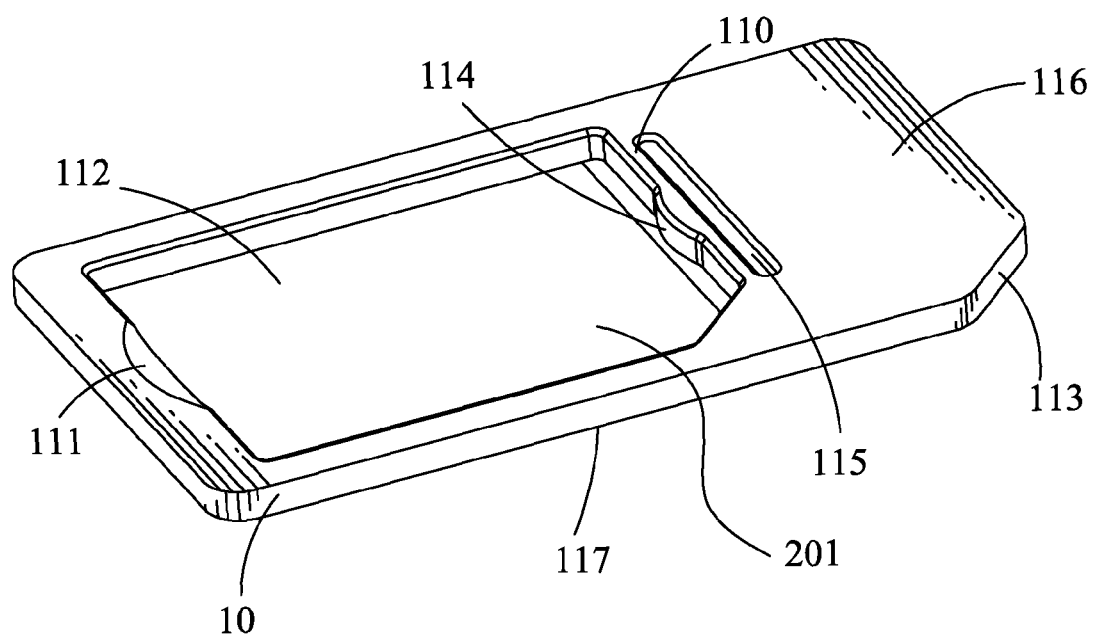
FIG. 1 is an assembled perspective view of a card holder in accordance with an embodiment of the present invention.
Figure 2:
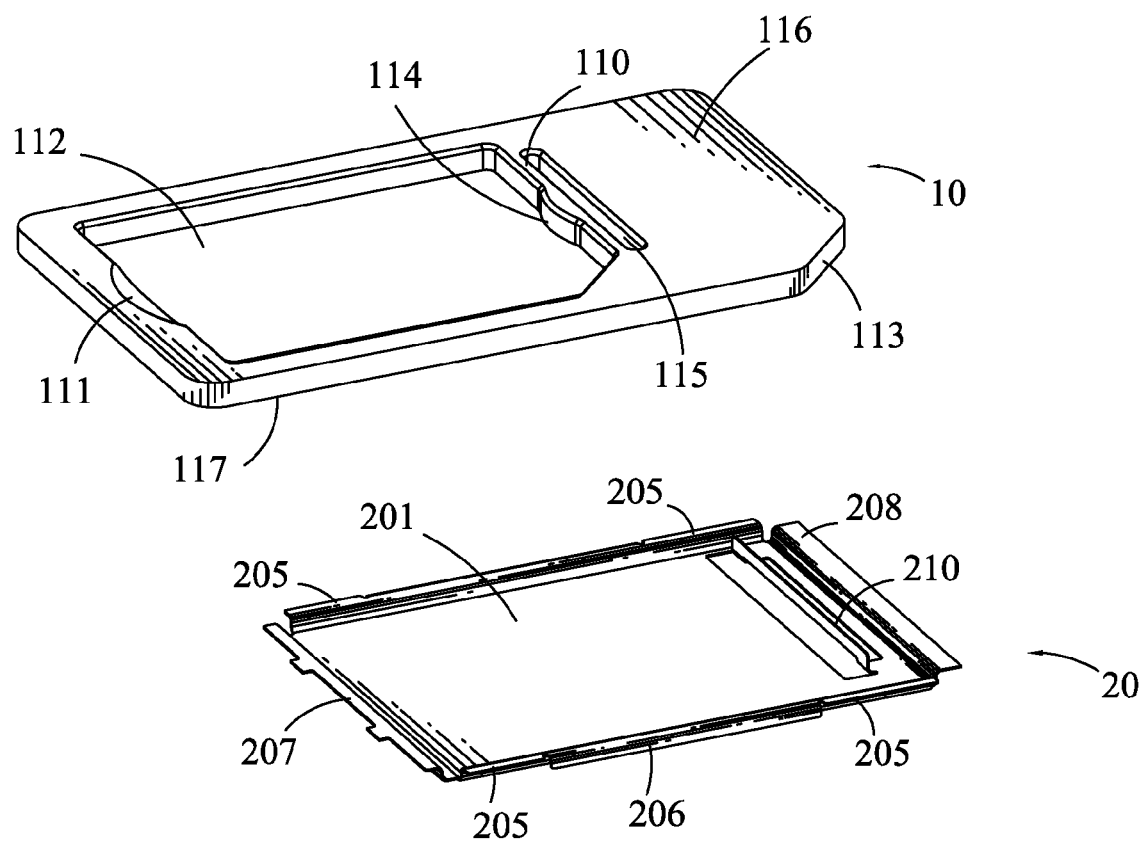
FIG. 2 is an exploded perspective view of the card holder shown in FIG. 1.
Figure 3:
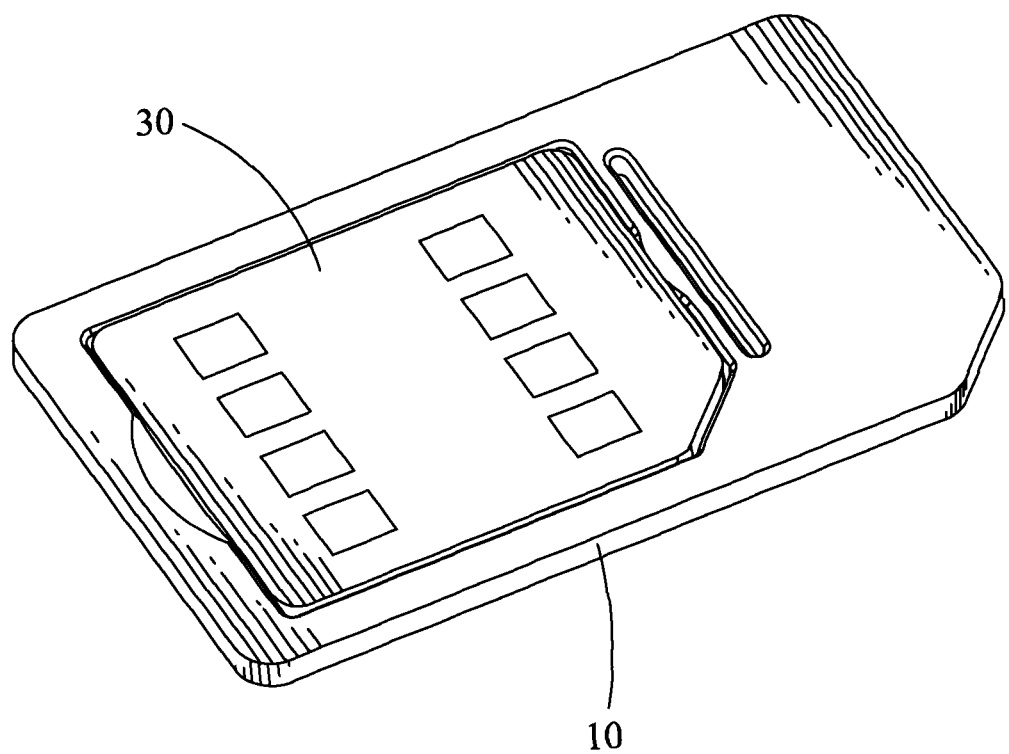
FIG. 3 is a use perspective view showing that a micro SIM card is assembled in the card holder shown in FIG. 1.

Referring to FIGS. 1-3, a card holder 100 according to an embodiment of the present invention is adapted for converting a micro SIM card 30 into a standard SIM card (not shown) in size and shape, and includes an insulating housing 10 and a metal part 20.

Referring to FIG. 2, the insulating housing 10 is of a flat board shape in accordance with the standard SIM card in size and shape, and defines a card groove 112 in accordance with the micro SIM card 30 in size and shape and in accordance with the standard SIM card in contact position for receiving the micro SIM card 30 in place. The card groove 112 penetrates through a top surface 116 and a bottom surface 117 of the insulating housing 10. At least one groove sidewall of the card groove 112 defines an open slot 115 penetrating through the top surface 116 and the bottom surface 117 of the insulating housing 10 and spaced from the card groove 112. Accordingly, at least one elastic arm 110 is formed between the open slot 115 and the card groove 112. A substantial middle of the elastic arm 110 protrudes into the card groove 112 to form a resisting portion 114 resisting against the micro SIM card 30 to secure the micro SIM card 30 in the card groove 112. One corner of the insulating housing 10 is designed with a slant face 113 according to the shape of the standard SIM card. The groove sidewall of the card groove 112 opposite to the elastic arm 110 defines a grasping gap 111 penetrating through the top surface 116 of the insulating housing 10 and communicating with the card groove 112 for the convenience of taking the micro SIM card 30 out of the card groove 112 therethrough.

Referring to FIG. 1 and FIG. 2, the metal part 20 is molded in the insulating housing 10 and exposed in the card groove 112 for supporting the micro SIM card 30 thereon. In detail, the metal part 20 has a bottom plate 201 of which a periphery side is molded in the groove sidewalls of the card groove 112 to make the bottom plate 201 exposed in the card groove 112 and further flush with the bottom surface 117 of the insulating housing 10 for supporting the micro SIM card 30 thereon. A plurality of fastening portions protrudes around the periphery side of the bottom plate 201 and is molded in the groove sidewalls of the card groove 112 to secure the metal part 20 and the insulating housing 10 together. In this embodiment, the two long sides of the bottom plate 201 bend upward and then outward to form a pair of first fastening portions 205. A middle portion of the first fastening portion 205 further bends downward to form a second fastening portion 206. The two short sides of the bottom plate 201 bend upward and then protrude outward to form a third fastening portion 207 and a fourth fastening portion 208 respectively. One end of the bottom plate 201 is die-cut upward to form a strengthening slice 210 integrated in the elastic arm 110 to enhance the elasticity of the elastic arm 110.

As described above, the card holder 100 includes the insulating housing 10 of the flat board shape which is in accordance with the standard SIM card in size and shape, and defines the card groove 112 in accordance with the micro SIM card 30 in size and shape and in accordance with the standard SIM card in contact position for receiving the micro SIM card 30 in place. At least one groove sidewall of the card groove 112 defines the open slot 115 for accordingly forming the elastic arm 110 between the open slot 115 and the card groove 112, wherein the elastic arm 110 further projects into the card groove 112 for resisting against the micro SIM card 30. By using the card holder 100, the micro SIM card 30 can be conveniently converted into the standard SIM card in size and shape. As a result, the micro SIM card 30 not only can be used in the mobile phone which is designed for receiving the micro SIM card 30 (shown in the prior art), but also can be used in the mobile phone adapted for receiving the standard SIM card therein (shown in the prior art) after being assembled in the card holder 100. Furthermore, one end of the bottom plate 201 of the metal part 20 is die-cut upward to form the strengthening slice 210 integrated in the elastic arm 110 so that enhances the elasticity of the elastic arm 110.

The foregoing description of the present invention has been presented for the purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A card holder adapted for converting a micro SIM card into a standard SIM card in size and shape, comprising:
   an insulating housing of a flat board shape which is in accordance with the standard SIM card in size and shape, and defines a card groove in accordance with the micro SIM card in size and shape and in accordance with the standard SIM card in contact position for receiving the micro SIM card in place, at least one groove sidewall of the card groove defining an open slot penetrating through a top surface and a bottom surface of the insulating housing and spaced from the card groove, accordingly, at least one elastic arm forming between the open slot and the card groove and further projecting into the card groove for resisting against the micro SIM card; and
   a metal part molded in the insulating housing and exposed in the card groove for supporting the micro SIM card thereon;
   wherein the card groove penetrates through the top surface and the bottom surface of the insulating housing, the metal part has a bottom plate of which a periphery side is molded in the groove sidewalls of the card groove to make the bottom plate exposed in the card groove and further flush with the bottom surface of the insulating housing for supporting the micro SIM card thereon, one end of the bottom plate is die-cut upward to form a strengthening slice integrated in the elastic arm to enhance the elasticity of the elastic arm.

2. The card holder as claimed in claim 1, wherein a substantial middle of the elastic arm protrudes into the card groove to form a resisting portion resisting against the micro SIM card to secure the micro SIM card in the card groove.

3. The card holder as claimed in claim 1, wherein a plurality of fastening portions protrudes around the periphery side of the bottom plate and are molded in the groove sidewalls of the card groove to secure the metal part and the insulating housing together.

4. The card holder as claimed in claim 3, wherein the two long sides of the bottom plate bend upward and then outward to form a pair of first fastening portions, a middle portion of the first fastening portion further bends downward to form a second fastening portion, the two short sides of the bottom plate bend upward and then protrude outward to form a third fastening portion and a fourth fastening portion respectively.

5. The card holder as claimed in claim 1, wherein one corner of the insulating housing is designed with a slant face according to the shape of the standard SIM card, the groove sidewall of the card groove opposite to the elastic arm defines a grasping gap penetrating through the top surface of the insulating housing and communicating with the card groove for the convenience of taking the micro SIM card out of the card groove therethrough.

* * * * *